United States Patent
Turner

(10) Patent No.: US 6,258,704 B1
(45) Date of Patent: Jul. 10, 2001

(54) METHODS FOR FABRICATING DIMPLED CONTACTS FOR METAL-TO-SEMICONDUCTOR CONNECTIONS

(75) Inventor: Gary B. Turner, Anaheim, CA (US)

(73) Assignee: Honeywell, Inc., Morristown, NJ (US)

( * ) Notice: Subject to any disclaimer, the term of this patent is extended or adjusted under 35 U.S.C. 154(b) by 0 days.

(21) Appl. No.: 09/596,161

(22) Filed: Jun. 16, 2000

Related U.S. Application Data

(62) Division of application No. 09/182,387, filed on Oct. 29, 1998, now Pat. No. 6,078,103.

(51) Int. Cl.⁷ .................................................. H01L 23/48
(52) U.S. Cl. ........................ 438/613; 438/612; 438/617
(58) Field of Search .................................. 458/612, 613, 458/617, 108

(56) References Cited

U.S. PATENT DOCUMENTS

| | | | |
|---|---|---|---|
| 4,188,636 | * | 2/1980 | Sato et al. . |
| 4,285,002 | * | 8/1981 | Campbell . |
| 4,568,962 | * | 2/1986 | Kalfus . |
| 4,929,999 | * | 5/1990 | Hoeherechts et al. . |
| 5,151,559 | * | 9/1992 | Conru et al. . |
| 5,502,631 | * | 3/1996 | Adachi . |
| 5,517,752 | * | 5/1996 | Sakata et al. . |
| 5,536,973 | * | 7/1996 | Yamaji . |
| 5,781,022 | * | 7/1998 | Wood et al. . |

\* cited by examiner

Primary Examiner—Roy Potter
(74) Attorney, Agent, or Firm—Kris T. Fredrick

(57) ABSTRACT

An improved electrical connection between a metal surface and a semiconductor surface is provided by the deposition of a conductive dimple on the metal surface, whereby the conductive dimple is interposed between the metal surface and the semiconductor substrate. For example, a conductive trace deposited on an insulating substrate may have a conductive dimple formed thereon. A semiconductor substrate, such as a silicon substrate, may be bonded to the insulating substrate over at least a portion of the metal trace having the dimple thereon to form an electrical connection between the semiconductor substrate and the conductive trace.

8 Claims, 4 Drawing Sheets

METHODS FOR FABRICATING DIMPLED CONTACTS FOR METAL-TO-SEMICONDUCTOR CONNECTIONS

CROSS-REFERENCE TO RELATED APPLICATIONS

This application is a divisional of U.S. application Ser. No. 09/182,387, filed Oct. 29, 1998 now U.S. Pat. No. 6,078,103.

FIELD OF THE INVENTION

The present invention generally relates to microelectronic fabrication, and more particularly, to electrical contacts between a metal surface and a semiconductor surface.

BACKGROUND OF THE INVENTION

In microelectronic fabrication, it is often desirable to form an electrical contact between a metal surface and a semiconductor surface. For example, microelectromechanical systems (MEMS) such as pressure sensors, accelerometers, yaw rate sensors, and micromotors may comprise a silicon mesa that is anodically bonded to an insulating substrate, such as glass, over a conductive trace. In such a design, the silicon mesa often operates as an anchor or support for a suspended structure such as a diaphragm, or microbeam, as is well known to those skilled in the art. The silicon mesa and conductive trace form an electrical contact which is preferably of low resistance, and ohmic in nature. Further, such an electrical contact should have minimum contact potential because of the sensitivity of many MEMS devices to electric charges or fields.

However, conventional techniques for forming low resistance, ohmic contacts between semiconductor surfaces and metal surfaces are often not satisfactory because they require several additional processing steps to prepare the semiconductor surface, or they produce inconsistent yields in terms of the electrical characteristics of the resulting contacts. For instance, one technique involves heavily doping the semiconductor substrate and then depositing a metal layer directly over the doped semiconductor surface. A sintering or annealing step is then performed to cause the diffusion of the metal layer into the semiconductor. The metal deposited on the semiconductor is essentially allowed to alloy slightly in order to form a better contact between the semiconductor surface and a metal surface. This technique is disfavored because, among other things, it requires several additional processing steps in order to prepare the semiconductor surface, which not only complicates the fabrication of the MEMS device, but also may increase the cost of the MEMS device.

An alternative technique is to directly bond the semiconductor substrate or surface to another substrate or surface over a metal trace so that the metal trace is pressed against the semiconductor substrate or surface. For example, if a semiconductor substrate (typically silicon) is anodically bonded to a glass substrate over a metal trace fabricated on the glass substrate, then the pressure of the contacting surface of the semiconductor substrate against the metal trace is relied upon to form the electrical contact. While it is generally recognized that heavily doped silicon pressed against a conductive trace may make an ohmic contact, it is also recognized that surface states and thin layers of oxide or other contaminants on the silicon surface may separate the silicon surface from the metal trace. The pressure of the anodic bond is generally not well controlled, and may not break through the layers of oxide or contaminants. Consequently, the resulting electrical contacts between the silicon and the metal trace generally have resistances that vary widely, and are typically high (e.g., from 100Ω to greater than 10 MΩ). Further, the resulting contacts are often non-ohmic, that is, the voltage drop across the contact is not proportional to the current, but rather, has a rectifying characteristic and/or a voltage offset or potential built into the contact. As a result, the operation, reliability, and stability of the resulting MEMS devices may be adversely affected.

Therefore, an unresolved need exists in the industry for a low resistance, ohmic contact between a metal surface and a semiconductor surface without depositing a metal layer directly on the semiconductor surface and without requiring other extensive preparation of the semiconductor surface.

SUMMARY OF THE INVENTION

It is an object of the present invention to provide an improved metal to semiconductor contact.

It is another object of the present invention to provide an improved method for fabricating electrical contacts between a metal trace and a semiconductor surface.

It is another object of the present invention to provide a low resistance, ohmic contact between a metal trace formed on an insulating substrate and a semiconductor surface bonded to the insulating substrate over the metal trace.

These and other objects are provided according to the present invention by a conductive dimple deposited on a metal surface that is in contact with a semiconductor surface, whereby the conductive dimple is interposed between the metal surface and the semiconductor surface. Upon bonding the semiconductor surface to an insulating surface such that the metal surface is positioned therebetween, the conductive dimple is essentially crushed by the forces bonding the semiconductor surface to the insulating surface. Thus, an intimate contact between the metal surface and the semiconductor surface is created. The electrical contact formed between the metal surface and the semiconductor surface is ohmic, and of consistently low resistance. Thus, the present invention provides an advantageous technique for obtaining a low resistance, ohmic contact without having to deposit a metal layer directly on the semiconductor surface. Further, the present invention consistently produces low resistance contact, which may significantly increase product yield, reliability, and stability (i.e., reduced long-term drift) of MEMS devices incorporating such a contact.

In accordance with an aspect of the present invention, a semiconductor device comprises an insulating substrate, a conductive trace formed on the insulating substrate, and a semiconductor element which is bonded to the insulating substrate, wherein a portion of the semiconductor element is bonded to the insulating substrate opposite the conductive trace so as to overlie and be in contact with the conductive trace. In addition, the present invention provides for a dimple comprising a layer of conductive material that is interposed between the conductive trace and the portion of the semiconductor element in contact with the conductive trace. The dimple is preferably fabricated on the conductive trace prior to the bonding of the semiconductor element to the insulating substrate. The dimple is formed so as to extend a sufficient height above the surface of the insulating substrate so that the dimple deforms during the bonding process. Thus, the dimple is able to create an intimate contact between the conductive trace and the semiconductor element. Further, the dimple is preferably of a compact, regular shape such as square or circle, though it will be recognized by those skilled in the art that the dimple may take elongated or other non-regular shapes as well.

The conductive trace may comprise a layer of almost any conductor, such as gold. The dimple may comprise a layer of the same material, such as gold or other soft metal such as silver, copper, potassium, sodium, lithium, cadmium, zinc, indium, gallium, aluminum, lead, tin, bismuth, antimony, arsenic, or their alloys. The insulating layer may comprise glass. If the insulating layer comprises glass, then the semiconductor element is preferably bonded to the glass substrate by anodic bonding.

In accordance with another aspect of the present invention, a microelectronic fabrication method for forming a pressure contact between a conductive trace and a semiconductor element comprises the steps of forming the conductive trace on an insulating substrate, forming at least one conductive dimple on the conductive trace, and attaching the semiconductor element to the insulating substrate opposite the conductive trace so as to overlie and contact the conductive dimple.

In the method, the step of attaching the semiconductor element to the insulating substrate may include the step of forming a eutectic bond comprising material from the conductive dimple and from the semiconductor element. In addition, the conductive trace may be formed by forming a recess in the insulating substrate, and then forming a layer of conductive material in the recess. In particular, the conductive trace may be formed by subsequently forming layers of titanium, platinum, and gold in the recess. Likewise, the conductive dimple may be formed by subsequently forming a layer of gold or sequential layers of platinum and gold. Further, the step of attaching may comprise anodically bonding the semiconductor element to the insulating substrate.

The method may further comprise the step of forming a release dimple on the insulating substrate, wherein the step of forming the conductive dimple and the step of forming the release dimple are performed substantially simultaneously. Therefore, a conductive dimple in accordance with the present invention may be formed without any additional process steps.

Other features and advantages of the present invention will become apparent to one that is skilled in the art upon examination of the following drawings and detailed description. It is intended that all such additional features and advantages be included herein within the scope of the present invention, as defined in the appended claims.

DETAILED DESCRIPTION OF THE PREFERRED EMBODIMENTS

I. Introduction

Figure 1:
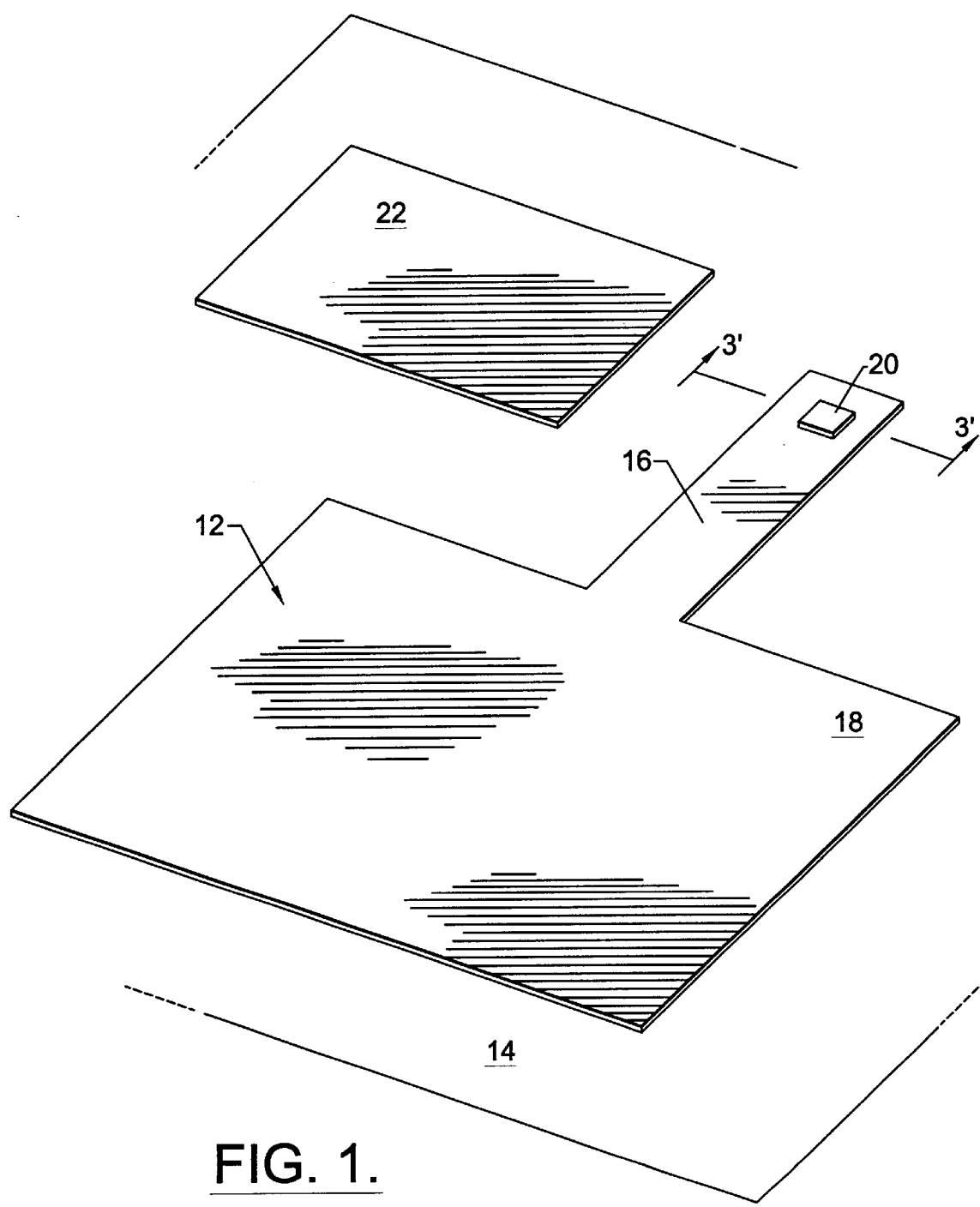
FIG. 1 is a perspective view of a conductive trace and electrode fabricated on an insulating substrate, wherein the conductive trace incorporates a conductive dimple in accordance with one embodiment of the present invention.

The present invention will now be described more fully hereafter with reference to the accompanying drawings, in which preferred embodiments of the invention are shown. This invention may, however, be embodied in many different forms and should not be construed as limited to the embodiments set forth herein. Rather, these embodiments are provided so that the disclosure will be thorough and complete, and will fully convey the scope of the invention to those skilled in the art. In the drawings, the elements are not necessarily drawn to scale. Furthermore, like reference numerals refer to like elements throughout.

The following description is of the best contemplated mode of carrying out the present invention. The structures and methods of the present invention have practical application in forming efficient electrical contact between a metal surface and a semiconductor surface. In particular, the present invention has application in the forming of such contacts during the fabrication of dissolved-wafer microelectromechanical systems (MEMS). For purposes of explanation and illustration, however, the particular application of the present invention as described herein is directed to forming an electrical contact between a metal trace formed on an insulating substrate and a separate silicon element attached to the insulating substrate by anodic bonding so as to form a cantilever MEMS device. Thus, the scope of the present invention should not be limited to that described hereinafter, but should be determined by referencing the appended claims.

II. Dimpled Contact

With reference to FIG. 1, illustrated is an intermediate structure in the fabrication of a cantilever MEMS device. In particular, a conductive trace 12 is fabricated on an insulating substrate 14, which is a glass substrate in the preferred embodiment. A trench or recess of the shape of the conductive trace 12 is etched in the insulating substrate 14. A layer of metal such as gold is then patterned in the recess to form the conductive trace 12. The thickness of the metal layer forming the conductive trace is typically greater than the depth of the recess in the glass substrate so that the conductive trace 12 projects or extends slightly above the unetched portion of the insulating substrate 14, typically about 200–800 angstroms. However, the conductive trace need not be formed in a trench, but can be formed upon a planar surface of the substrate if so desired.

The conductive trace 12 comprises a tongue 16 and a bonding pad 18. The bonding pad 18 may be provided for forming connections to external devices via wirebonding, as well known in the industry. It is noted that the conductive trace 12 may take other shapes as desired. To that extent, the tongue 16 may have a variety of dimensions such as 10 $\mu$m×25 $\mu$m, 20 $\mu$m×25 $\mu$m, 40 $\mu$m×25 $\mu$m, or 40 $\mu$m×50 $\mu$m. However, the dimensions of the tongue 16 are generally of no significant importance with regard to the present invention.

A dimple 20 in accordance with the present invention is formed in a substantially central location on tongue 16. It is noted, however, depending upon the geometry of tongue 16, the dimple 20 may be located closest to the distal end of tongue 16. Further, tongue 16 may have more than one dimple 20 formed thereon. The dimple 20 is preferably made of a conductive metal such as gold, and moreover, preferably comprises the same metal as the conductive trace 12. While the dimple 20 is shown in a substantially square configuration, it is recognized that the dimple 20 can take any other regular shape such as triangle, rectangle, circle, or any non-regular shape, as may be desired. For purposes of the present embodiment, the dimple 20 is 5 μm×5 μm, and approximately 2,000 to 5,000 angstroms thick.

In order to form the MEMS device of the illustrated embodiment, an electrode 22 is also fabricated on the glass substrate 14. The electrode 22 is formed proximate the tongue 16, as illustrated. Preferably, the electrode 22 comprises a conductive metal such as gold, and therefore, can be fabricated simultaneously with conductive trace 12.

Figure 2:
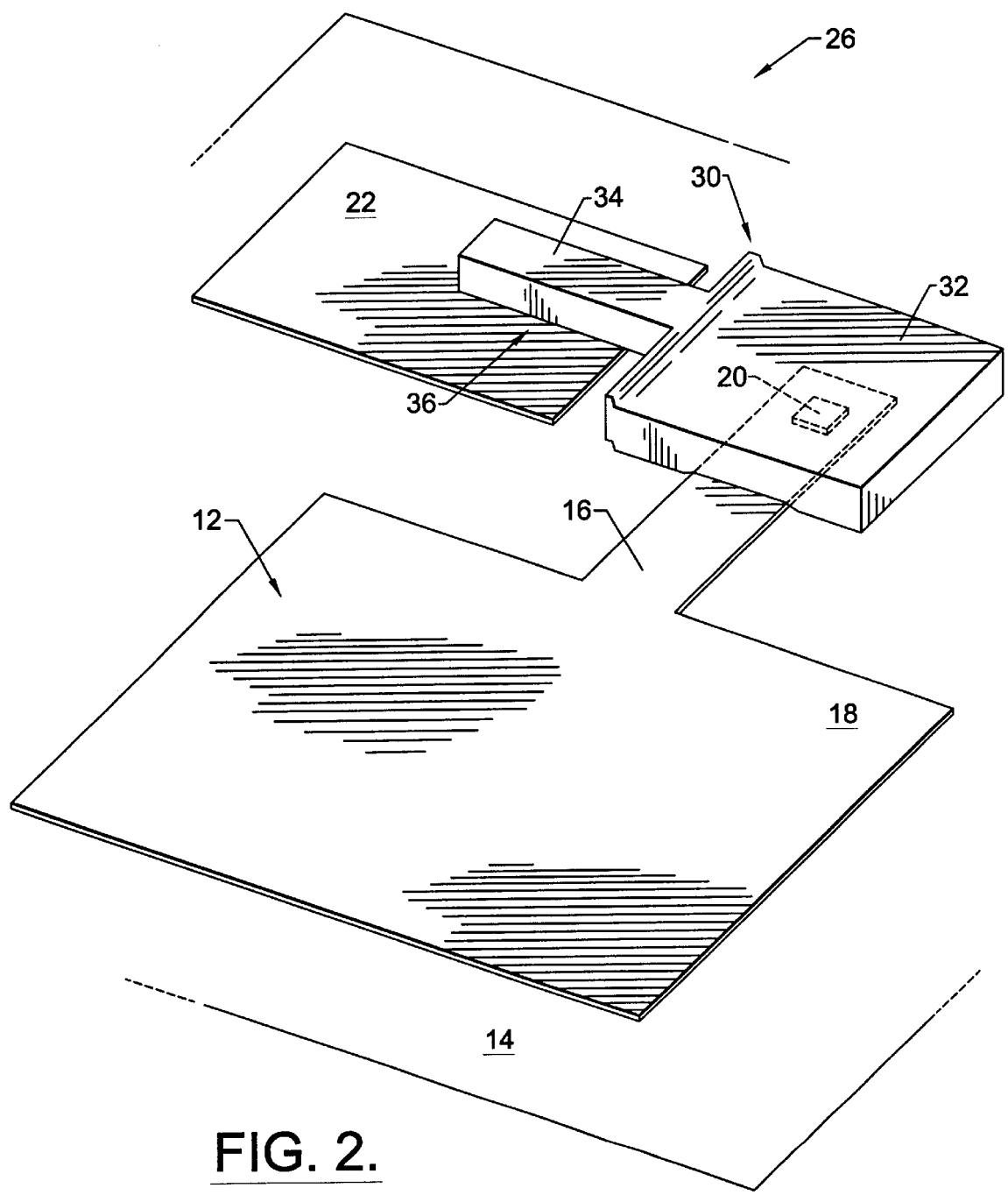
FIG. 2 is a perspective view of the conductive trace of FIG. 1 with a silicon mesa bonded to the trace to form a microelectromechanical system.

With reference to FIG. 2, illustrated is a MEMS device 26 fabricated using the conductive trace 12 of FIG. 1. A semiconductor element 30 has been bonded to the insulating substrate 14 opposite at least the portion of tongue 16 which includes dimple 20, as shown in dashed lines. The semiconductor element 30 comprises a mesa 32 which is physically bonded to the insulating substrate 14, and a cantilever 34 extending from the mesa 32, and suspended over the electrode 22. In the preferred embodiment, the semiconductor element 30 is made of silicon. However, the semiconductor element can be made of other materials if so desired.

A gap 36 exists between the cantilever 34 and electrode 22 so that the cantilever can selectively contact the electrode 22. The size of the gap 36 may be controlled during the fabrication of the semiconductor element 30, as described in detail below. In the preferred embodiment, the gap 36 is approximately 3 μm.

The mesa 32 is preferably bonded to the insulating substrate 14 via anodic bonding, which is a well-known technique in the industry for bonding silicon to glass. Accordingly, the pressure created by the mesa 32 being attracted to the insulating substrate 14 essentially crushes the dimple 20 underneath the mesa 32, forming an intimate contact between the silicon mesa 32 and the tongue 16. In accordance with the present invention, the dimple 20 provides for the concentration of pressure in a relatively small area. Although the inventors do not wish to be bound by any particular theory of operation, the present inventors believe that the concentration of pressure does at least one of the following in creating the intimate electrical contact between the silicon mesa 32 and the tongue 16. First, the high pressure may reduce the eutectic temperature of the gold-silicon mixture to below that of the anodic bonding environment so that a highly conductive eutectic forms in the area of the dimple, yet not with the relatively low pressure tongue 16. Second, the high pressure may cause the plastic flow of the gold forming the dimple 20, which pushes aside any oxide or other contaminants between the silicon mesa 32 and the tongue 16. In either case, the resulting contact has low resistance and is ohmic.

Therefore, the geometry and dimensions of dimple 20 are preferably designed so that sufficient pressure is applied to the dimple 20 during the anodic bonding process to create the intimate contact. It is noted that the pressure applied to the dimple 20 by the electrostatic forces of the anodic bonding process is inversely proportional to the distance between the mesa 32 and the insulating substrate 14. Thus, the closer the mesa is to the substrate 14, the greater the compressive forces on the dimple 20.

As a result of the use of the dimple 20 in forming the MEMS device, the electrical contact formed between the semiconductor element 30 and the conductive trace 12 is a low resistance, ohmic contact. As mentioned above, the dimple 20 has broad application in forming efficient electrical contacts between a conductor, such as gold, and a semiconductor.

III. Fabrication

Figure 3A:
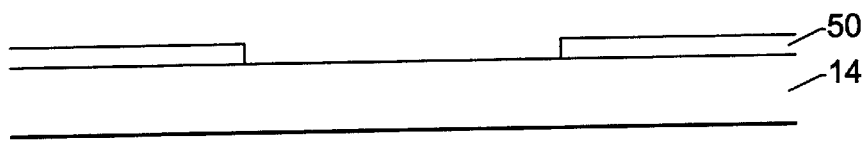
FIGS. 3A–3G are cross-sectional views illustrating steps of a method for fabricating a conductive dimple on a conductive trace in accordance with one embodiment of the present invention, and taken along line 3'—3' of FIG. 1.
Figure 3B:
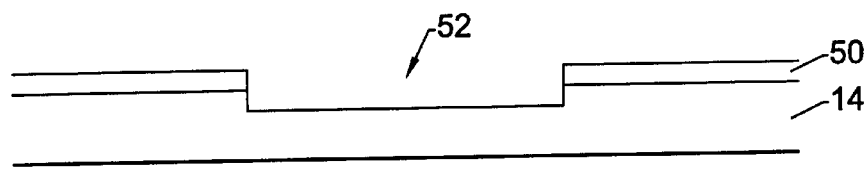

FIGS. 3A–3G are cross-sectional views illustrating steps of a method for fabricating a dimple 20 in accordance with one advantageous aspect of the present invention, as viewed along lines 3'—3' of FIG. 1. As shown in FIG. 3A, a patterned photoresist layer 50 is formed on the insulating substrate 14. The substrate is then immersed in hydrofluoric acid bath so as to isotropically etch the glass to form a trench or recess 52 of a predetermined depth, preferably between 1,000–2,000 angstroms deep, as shown in FIG. 3B.

Figure 3C:
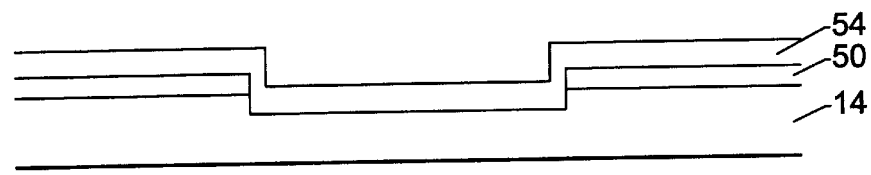

In FIG. 3C, a metallic layer 54 of a predetermined thickness is formed on the patterned photoresist layer 50 and the exposed portion of the insulating substrate 14 using an electron beam (e-beam) evaporation technique. In the preferred embodiment, the metallic layer 54 comprises an adhesive layer of titanium, and an intermetallic layer of platinum and a conductor layer of gold sequentially formed. By way of example, if the recess 52 were approximately 1,700 angstroms deep, then the metallic layer 54 would comprise a titanium layer about 200 angstroms thick, a platinum layer about 400 angstroms thick, and a gold layer about 1,700 angstroms thick. Note that the resulting metallic layer, such as the tongue 16, would project or extend approximately 600 angstroms above the unetched portion of the insulating substrate 14, which facilitates contact between the tongue and the semiconductor element 30 when bonded.

Figure 3D:
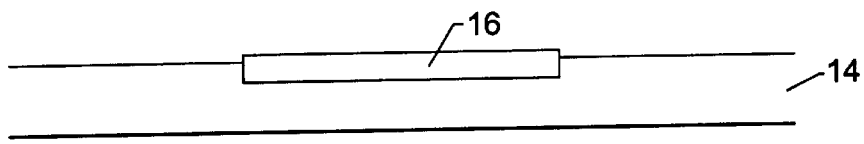
Figure 3E:
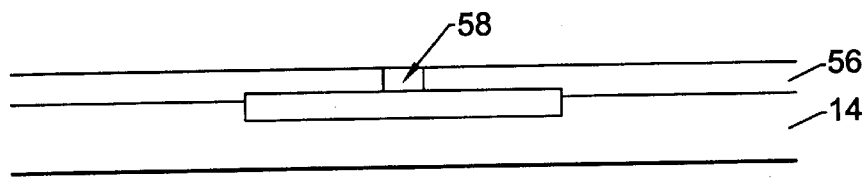
Figure 3F:
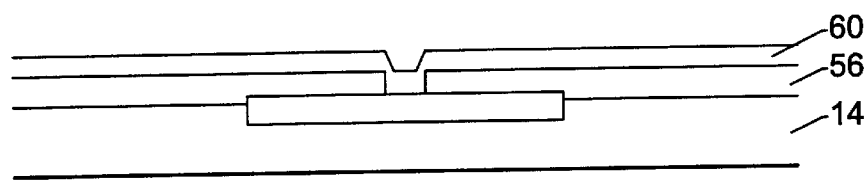

The insulating substrate 14 is then immersed in a solvent such as acetone which dissolves the photoresist layer 50 so as to lift off the metallic layer 54 everywhere except for that deposited in recess 52, as illustrated in FIG. 3D. According to the illustrative embodiment, the resulting structure is tongue 16. A second patterned photoresist layer 56 is formed on the insulating substrate 14 and tongue 16 so as to form a hole 58, as illustrated in FIG. 3E. In a preferred embodiment, the hole 58 is approximately 5 μm×5 μm square. A second metallic layer 60 of a predetermined thickness is deposited over the photoresist layer 56 and the portion of tongue 16 exposed by hole 58, as illustrated in FIG. 3F. In a preferred embodiment, the metallic layer 60 comprises an adhesive layer of platinum and a conductor layer of gold sequentially formed. In the same example given above for metallic layer 54, the metallic layer 60 comprises a platinum layer about 500 angstroms thick and a gold layer about 2,500 angstroms thick. Accordingly, the resulting dimple 20 extends or projects approximately 3,000 angstroms above the tongue 16, and approximately 3,600 angstroms above the unetched portion of the insulating substrate 14.

Figure 3G:
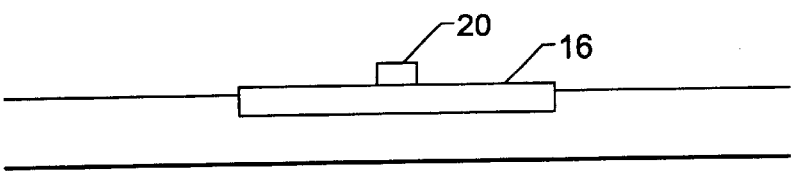

In FIG. 3G, the substrate is immersed in a solvent that dissolves the photoresist layer 56 so as to lift off the metallic layer 60 everywhere except for that in recess 58 which forms dimple 20. It is noted that it is preferred that dimple 20 be at least 2,000 angstroms thick so that adequate pressure is supplied thereto in the anodic bonding process, as discussed below with reference to FIG. 4. The insulating substrate 14 is now ready to be bonded to the semiconductor element 30.

For purposes of the present disclosure, the semiconductor element 30 is fabricated utilizing a dissolved wafer process whereby the semiconductor element 30 is formed via a diffused silicon wafer process. However, it will be recognized by those skilled in the art that the mesa of the semiconductor element 30 may be integrally formed in the insulating substrate 14 if so desired. In addition, it is noted that other methods may be utilized to form the semiconductor element 30, as will be appreciated by those of ordinary skill in the art.

The semiconductor element can be formed by initially depositing a patterned photoresist layer on an undoped or lightly doped silicon wafer 68. It is known that the photoresist is patterned on the silicon wafer where the anchor or mesa 32 will be located. The silicon wafer is then etched a predetermined depth, preferably approximately 3 μm. The photoresist layer is then removed leaving a mesa approximately 3 μm tall on the silicon wafer. The silicon wafer is then placed in a diffusion furnace where boron is diffused into the mesa side of the silicon wafer at high temperatures. The diffusion process is performed for a predetermined period of time in order to provide a predetermined depth of diffusion, for example, 8 μm in a preferred embodiment. Note that the diffusion depth follows the profile of the surface of the silicon wafer, that is, the diffusion is approximately 8 μm deep under the mesa and approximately 8 μm deep under the etched surface. Next, reactive ion etching is utilized to form an outline around the desired shape of the semiconductor element 30, including the mesa 32 and the cantilever 34. Reactive ion etching is used to make a deep cut, for instance, 10 μm deep in the preferred embodiment. Thus, the cut will be below the depth of the boron diffusion. The silicon wafer 68 is now ready to be anodically bonded to the insulating substrate 14.

Figure 4:
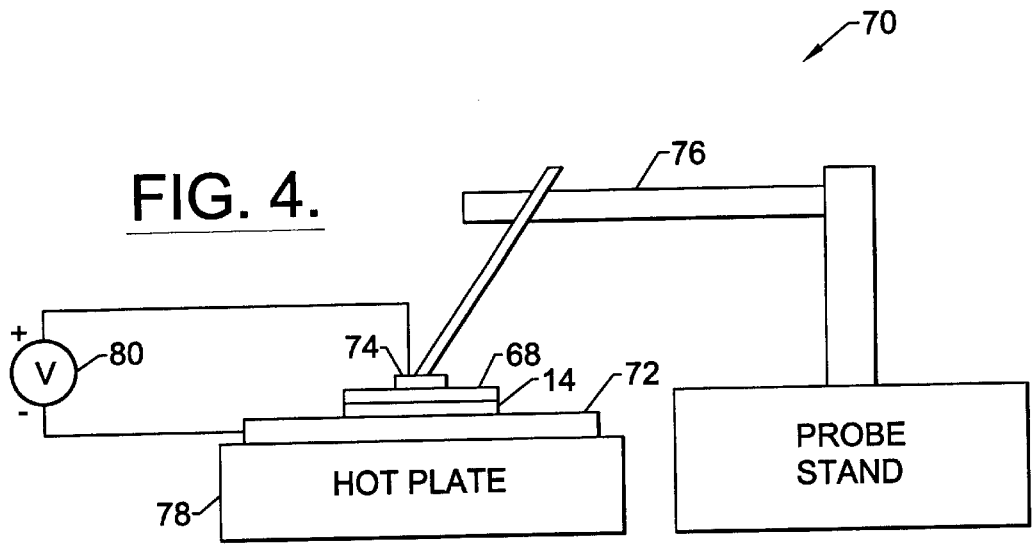
FIG. 4 is a schematic drawing of a system for anodically bonding silicon to glass.

With reference to FIG. 4, an anodic bonding system 70 is illustrated. In particular, the insulating substrate 14 and the silicon wafer 68 are placed against one another in a predetermined orientation so that the mesa 32 is opposite at least a portion of the tongue 16, including dimple 20, as illustrated by the orientation shown in FIG. 2. In one embodiment, the insulating substrate 14 and the silicon wafer 68 are sandwiched between an aluminum anode 72 and a graphite cathode 74. The graphite cathode 74 is held in place by a probe 76 which applies a small amount of force to maintain the silicon wafer 68 and insulating substrate 14 in proper alignment. In the illustrative embodiment, the insulating substrate 14 and silicon wafer 68 are heated to a predetermined temperature, typically between 300–500° C., such as by a hotplate 78. Once the appropriate temperature is reached, a DC power supply 80 applies a potential across the silicon wafer 68 and the insulating substrate 14 with the indicated bias. The voltage is typically in the range of 250–1,000 volts. The temperature and voltage are maintained for a period of time, for example, approximately one hour, to adequately create the anodic bond between the silicon and glass. The voltage is then removed and the hotplate is then turned off in order to allow the bonded structure to cool. It is noted that during the anodic bonding step, the dimple 20 is crushed as the semiconductor element 30 of the silicon wafer 68 is pulled closer and closer to the insulating substrate 14 by the electrostatic forces created by the anodic bond. It is also noted, as mentioned above, that the temperature of the anodic bonding process is theorized to be above the melting point of the silicon-gold eutectic formed by the dimple 20 and mesa 32, thus forming a silicon-gold eutectic which may possibly be at least partially responsible for the improved electrical contact.

Following the anodic bonding step, the undoped or lightly doped silicon can be selectively removed. For example, the bonded structure comprising the silicon wafer 68 and the insulating substrate 14 is typically immersed in a bath of EDP (ethylenediaminepyrocatechol) etchant which selectively etches away the undoped or lightly doped silicon, leaving the boron diffused portion comprising the semiconductor element 30, which is bonded to the insulating substrate 14. Because of the 3 μm difference in height between the mesa 32 and the cantilever 34, the cantilever is spaced apart from the electrode 22 to create a gap 36 of approximately 3 μm.

An advantage of the dimples 20 formed in accordance with the present invention is that they can be formed simultaneously with release dimples (not shown) formed on the electrode 22 beneath the cantilever 34. While it is not necessary that the release dimples be made of a conductive material such as gold, the release dimples and dimples 20 may conveniently be formed at substantially the same time. The purpose of the release dimples is as follows. Once the insulating substrate 14 is removed from the EDP bath, it is rinsed in a water bath. As it is removed from the water bath, small amounts of contaminants are lifted out of the water bath in the water remaining on the insulating substrate 14, and migrate with the evaporation of the water. A film of water between the cantilever 34 and the electrode 22 typically dries from the proximal end of the cantilever 34, and adjacent to the mesa 32, toward its distal end. As the water continues to dry underneath the cantilever 34, the surface tension of the water tends to pull the cantilever down toward the electrode 22. It has been recognized that a sufficient forces can be applied by the surface tension to pull the cantilever 34 down until the tip of the cantilever 34 touches the contact pad 22. As impurities are carried by the evaporating water toward the tip of the cantilever 34, it begins to form a sort of adhesive that causes the cantilever to permanently stick to the electrode 22 once the water completely dries. In order to prevent the cantilever from permanently sticking to the electrode 22, release dimples are fabricated on the electrode 22 beneath the tip of the cantilever 34. The release dimples are designed to have a relatively small perimeter dimension so as to concentrate the last bit of water in an area that minimizes the amount of surface area of the evaporating water. By reducing the surface area of the evaporating water, the forces pulling the tip of the cantilever down to the electrode 22 are less than the strength of the cantilever 34. And therefore, the cantilever 34 will release from the electrode 22 as the water evaporates.

Since the release dimples are formed on the electrode 22 prior to the bonding of the semiconductor element 30 to the insulating substrate 14, the dimples 20 can be fabricated at substantially the same time without any additional processing steps. This is a significant advantage since the dimples 20 can be fabricated without adding to the cost or without adding processing steps for the resulting MEMS devices.

IV. Performance

Figure 5:
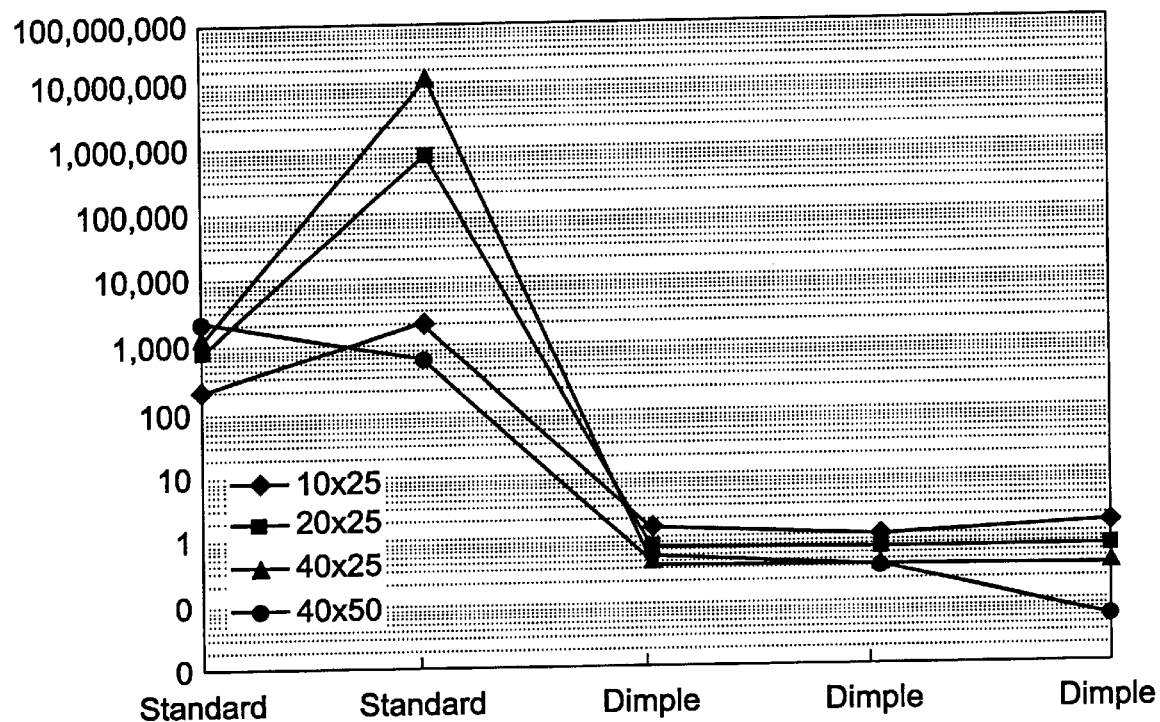
FIG. 5 is a graph comparing the contact resistances of conductive traces of varying dimensions which incorporate a conductive dimple in accordance with the invention versus the resistances of similarly dimensioned conductive traces which do not incorporate conductive dimples.

As evidence of the improved electrical contacts formed by the present invention, the test results from five process evaluation chips (PECs) are provided in FIG. 5. Each PEC tested had four terminal connections, each with a different area (ie., 10 μm×25 μm denoted by diamonds, 20 μm×25 μm denoted by squares, 40 μm×25 μm denoted by triangles, and 40 μm×50 μm denoted by circles). Two of the PEC's had standard contacts while the other three had dimpled contacts in accordance with the present invention, as indicated on the horizontal axis of the graph of FIG. 5. On the vertical axis, the contact resistances are plotted. As shown by FIG. 5, the dimpled contacts not only provide much lower resistances, they provided more consistent resistances as compared to the standard contacts. Based on the empirical data presented in FIG. 5, metal-semiconductor contacts formed in accordance with the present invention utilizing dimples 20 generally produce contact resistances between 0.1Ω to 2Ω.

In the drawings and specification, there have been disclosed typical preferred embodiments of the invention, and although specific terms are employed, they are used in a generic and descriptive sense only, and not for the purposes of limitation; the scope of the invention being set forth in the following claims.

Wherefore, the following is claimed:

1. A microelectronic fabrication method for forming a pressure contact between a conductive trace and semiconductor element, comprising the steps of:

forming the conductive trace on an insulating substrate;

forming at least one conductive dimple on the conductive trace, wherein the conductive dimple comprises a eutectic; and attaching a semiconductor element to the insulating substrate such that the semiconductor element overlies the conductive trace and the conductive dimple to merely form an electrical connection between the semiconductor element and the conductive trace.

2. The microelectronic fabrication method of claim 1, wherein said step of attaching includes the step of forming a eutectic comprising the conductive dimple and the semiconductor element.

3. The microelectronic fabrication method of claim 1, wherein said step of forming the conductive trace on the insulating substrate includes forming a recess in the insulating substrate and forming a layer of conductive material in the recess.

4. The microelectronic fabrication method of claim 1, wherein said step of attaching comprise the step of anodically bonding the semiconductor element to the insulating substrate.

5. The microelectronic fabrication method of claim 1, wherein said step of forming the conductive trace includes the steps of sequentially forming a layer of titanium, a layer of platinum, and a layer of gold in the recess.

6. The microelectronic fabrication method of claim 1, wherein said step of forming the conductive dimple includes the step of forming a layer of gold.

7. The microelectronic fabrication method of claim 1, wherein said step of forming the conductive dimple includes the step of sequentially forming a layer of platinum and a layer of gold.

8. The microelectronic fabrication method of claim 1, further comprising the step of forming a release dimple on the insulating substrate, and wherein said step of forming the conductive dimple and said step of forming the release dimple are performed substantially simultaneously.

* * * * *